United States Patent
Chen et al.

(10) Patent No.: US 7,557,000 B2
(45) Date of Patent: Jul. 7, 2009

(54) ETCHING METHOD AND STRUCTURE USING A HARD MASK FOR STRAINED SILICON MOS TRANSISTORS

(75) Inventors: John Chen, Shanghai (CN); Hanming Wu, Shanghai (CN); Da Wei Gao, Shanghai (CN); Bei Zhu, Shanghai (CN); Paolo Bonfanti, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 323 days.

(21) Appl. No.: 11/609,748

(22) Filed: Dec. 12, 2006

(65) Prior Publication Data

US 2008/0119032 A1   May 22, 2008

(30) Foreign Application Priority Data

Nov. 20, 2006   (CN) .................... 2006 1 0118722

(51) Int. Cl.
  *H01L 21/8238* (2006.01)
(52) U.S. Cl. ................ 438/222; 438/938; 257/E21.634
(58) Field of Classification Search ................ 438/222, 438/226, 938; 257/E21.634
  See application file for complete search history.

(56) References Cited

U.S. PATENT DOCUMENTS

| | | | |
|---|---|---|---|
| 6,121,100 A * | 9/2000 | Andideh et al. ............. | 438/305 |
| 6,881,635 B1 * | 4/2005 | Chidambarrao et al. ..... | 438/300 |
| 7,078,722 B2 * | 7/2006 | Anderson et al. ............ | 257/19 |

* cited by examiner

Primary Examiner—Chandra Chaudhari
(74) Attorney, Agent, or Firm—Townsend and Townsend and Crew LLP

(57) ABSTRACT

A method for forming an strained silicon integrated circuit device. The method includes providing a semiconductor substrate and forming a dielectric layer overlying the semiconductor substrate. The method also includes forming a gate layer overlying the dielectric layer and forming a hard mask overlying the gate layer. The method patterns the gate layer to form a gate structure including edges using the hard mask as a protective layer. The method forms a dielectric layer overlying the gate structure to protect the gate structure including the edges. The method forms spacers from the dielectric layer, while maintaining the hard mask overlying the gate structure. The method etches a source region and a drain region adjacent to the gate structure using the dielectric layer and the hard mask as a protective layer, while the hard mask prevents any portion of the gate structure from being exposed. In a preferred embodiment, the method maintains the hard mask overlying the gate structure. The method includes depositing silicon germanium material into the source region and the drain region to fill the etched source region and the etched drain region, while maintaining any portion of the gate layer from being exposed using the hard mask such that the gate structure is substantially free from any permanent deposition of silicon germanium material, which causes a channel region between the source region and the drain region to be strained in compressive mode from at least the silicon germanium material formed in the source region and the drain region. In a preferred embodiment, the method removing the hard mask from the gate structure to expose a top portion of the gate structure and maintains the top portion of the gate structure being substantially free from any silicon germanium material.

20 Claims, 2 Drawing Sheets

ETCHING METHOD AND STRUCTURE USING A HARD MASK FOR STRAINED SILICON MOS TRANSISTORS

CROSS-REFERENCES TO RELATED APPLICATIONS

This application claims priority to Chinese Application No. 200610118722.0, filed Nov. 20, 2006, commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming an strained silicon integrated circuit device. The method includes providing a semiconductor substrate and forming a dielectric layer overlying the semiconductor substrate. The method also includes forming a gate layer overlying the dielectric layer and forming a hard mask overlying the gate layer. The method patterns the gate layer to form a gate structure including edges using the hard mask as a protective layer. The method forms a dielectric layer overlying the gate structure to protect the gate structure including the edges. The method forms spacers from the dielectric layer, while maintaining the hard mask overlying the gate structure. The method etches a source region and a drain region adjacent to the gate structure using the dielectric layer and the hard mask as a protective layer, while the hard mask prevents any portion of the gate structure from being exposed. In a preferred embodiment, the method maintains the hard mask overlying the gate structure. The method includes depositing silicon germanium material into the source region and the drain region to fill the etched source region and the etched drain region, while maintaining any portion of the gate layer from being exposed using the hard mask such that the gate structure is substantially free from any permanent deposition of silicon germanium material, which causes a channel region between the source region and the drain region to be strained in compressive mode from at least the silicon germanium material formed in the source region and the drain region. In a preferred embodiment, the method removing the hard mask from the gate structure to expose a top portion of the gate structure and maintains the top portion of the gate structure being substantially free from any silicon germanium material.

In a specific embodiment, the present invention provides a method using a silicon germanium fill material, which has a larger lattice spacing than single crystal silicon material. Such larger lattice spacing of silicon germanium fill material causes a channel region of an MOS transistor to be in a slightly compressive mode, when such material has been deposited in recessed regions adjacent to the channel region. Although the lattice spacing is slightly larger, silicon germanium still grows within the recessed regions, which are substantially single crystal silicon bearing material. Of course, there may be other variations, medications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

Figure 1:
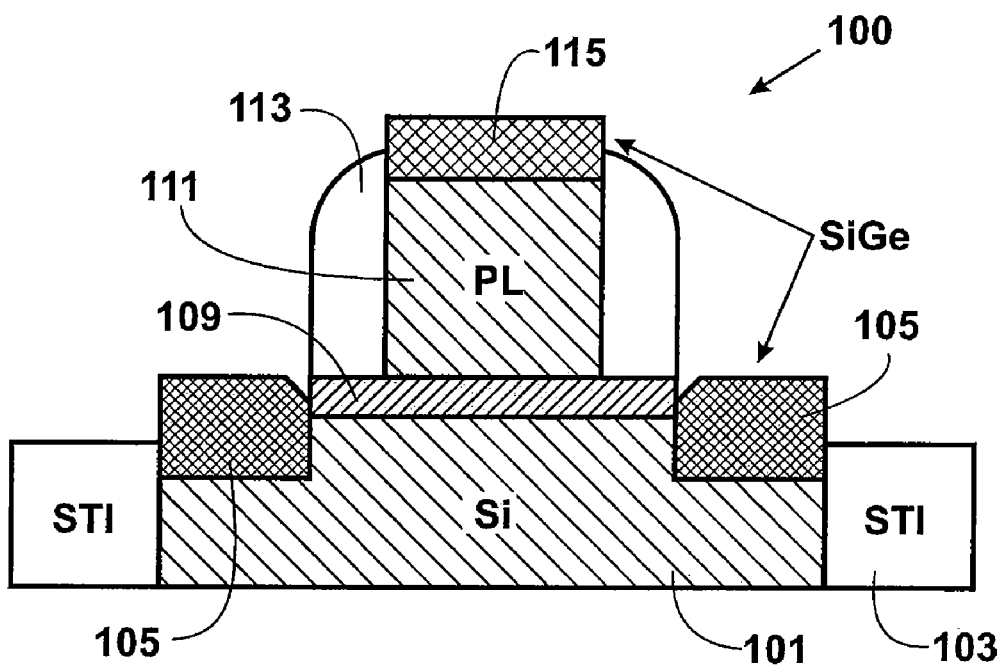
FIG. 1 is a simplified cross-sectional view diagram of a conventional strained silicon device.

FIG. 1 is a simplified cross-sectional view diagram of a conventional strained silicon device 100. As shown, the device includes silicon substrate 101. Trench isolation regions 103 are formed in the substrate. A gate dielectric layer 109 is overlying the surface of the substrate. The device also has gate structure 111, which includes sidewall spacer structures 113. Upon forming the strained silicon regions of the device, silicon germanium regions 105 are formed as source/drain regions. As an artifact of such source/drain regions silicon germanium 115 also forms on top of the gate structure, which is often has polysilicon material exposed thereon. The silicon germanium material on the gate structure must often be removed using etching techniques. Unfortunately, it is often difficult to remove substantially all of such silicon germanium material, which leads to device functionality and reliability issues. The present invention overcomes one or more of these limitations. Details of the present invention can be found throughout the present specification and more particularly below.

A method for fabricating an integrated circuit device according to an embodiment of the present invention may be outlined as follows:

1. Provide a semiconductor substrate, e.g., silicon wafer, silicon on insulator;
2. Form a dielectric layer (e.g., gate oxide or nitride) overlying the semiconductor substrate;
3. Form a gate layer (e.g., polysilicon, metal) overlying the dielectric layer;
4. Form a hard mask layer overlying the dielectric layer;
5. Pattern the gate layer, including the metal hard mask layer, to form a gate structure including edges (e.g., a plurality of sides or edges);
6. Form a dielectric layer overlying the gate structure to protect the gate structure including the edges;
7. Pattern the dielectric layer to form sidewall spacers on edges of the gate structure;
8. Optionally, expose a portion of the hard mask layer during the pattern of the dielectric layer;
9. Etch the source region and the drain region adjacent to the gate structure using the dielectric layer and hard mask as the protective layer;
10. Deposit silicon germanium material into the source region and the drain region to fill the etched source region and the etched drain region, while using the hard mask to prevent formation of the silicon germanium material on the gate structure;
11. Cause a channel region between the source region and the drain region to be strained in compressive mode from at least the silicon germanium material formed in the source region and the drain region, wherein the channel region is about the same width as the patterned gate layer;
12. Selectively remove the hard mask using a selective etching species; and
13. Perform other steps, as desired.

The above sequence of steps provides a method according to an embodiment of the present invention. As shown, the method uses a combination of steps including a way of forming an integrated circuit device such as an N-type channel device for a CMOS integrated circuit. As shown, the method includes using a hard mask as a protective layer for forming the etched source/drain regions and selectively depositing silicon germanium fill material into the etched source/drain regions. Other alternatives can also be provided where steps are added, one or more steps are removed, or one or more steps are provided in a different sequence without departing from the scope of the claims herein. Further details of the present method can be found throughout the present specification and more particularly below.

A method for fabricating a CMOS integrated circuit device according to an alternative embodiment of the present invention may be outlined as follows:

1. Provide a semiconductor substrate, e.g., silicon wafer, silicon on insulator;
2. Form a gate dielectric layer overlying the surface of the substrate;
3. Form a gate layer overlying the semiconductor substrate;
4. Form a hard mask layer overlying the gate layer;
5. Pattern the gate layer, including the hard mask layer, to form an NMOS gate structure including edges and a PMOS gate structure including edges;
6. Form a dielectric layer overlying the NMOS gate structure to protect the NMOS gate structure including the edges and overlying the PMOS gate structure to protect the PMOS gate structure including the edges;
7. Form sidewall spacers on edges of the gate structures from the dielectric layer;
8. Optionally, expose a portion of the hard mask layer on the gate structures;
9. Simultaneously etch a first source region and a first drain region adjacent to the NMOS gate structure and etch a second source region and a second drain region adjacent to the PMOS gate structure using the dielectric layer and exposed portion of the hard mask layer as a protective layer;
10. Pretreat etched source/drain regions;
11. Mask NMOS regions;
12. Deposit silicon germanium material into the first source region and the first drain region to cause a channel region between the first source region and the first drain region of the PMOS gate structure to be strained in a compressive mode, while using the hard mask to prevent formation of the silicon germanium material on the PMOS gate structure;
13. Strip Mask from NMOS regions;
14. Mask PMOS regions;
15. Deposit silicon carbide material into the second source region and second drain region to cause the channel region between the second source region and the second drain region of the NMOS gate structure to be strained in a tensile mode, while using the hard mask to prevent formation of the silicon carbide material on the NMOS gate structure; and 16. Selectively remove the hard mask using a selective etching species; and 17. Perform other steps, as desired.

The above sequence of steps provides a method according to an embodiment of the present invention. As shown, the method uses a combination of steps including a way of forming a CMOS integrated circuit device. As shown, the method includes using a substantially pure silicon dioxide hard mask as a protective layer for forming the etched source/drain regions and selectively depositing silicon germanium or other fill material in the etched source/drain regions. Other alternatives can also be provided where steps are added, one or more steps are removed, or one or more steps are provided in a different sequence without departing from the scope of the claims herein. Further details of the present device can be found throughout the present specification and more particularly below.

Figure 2:
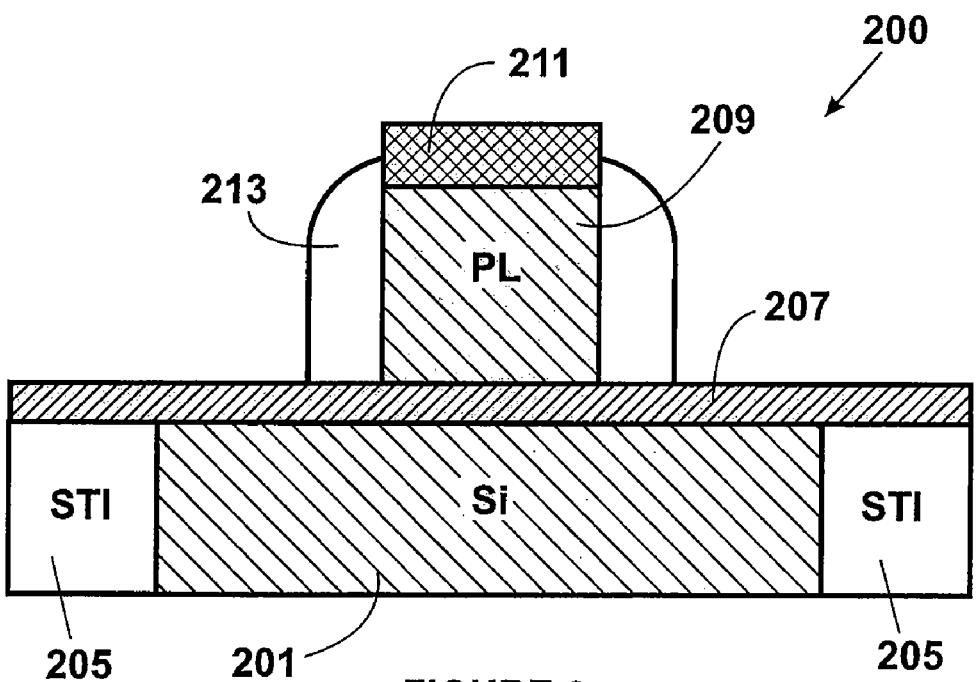
FIGS. 2 through 4 are simplified cross-sectional view diagram of a method for fabricating a CMOS device according to an embodiment of the present invention.
Figure 3:
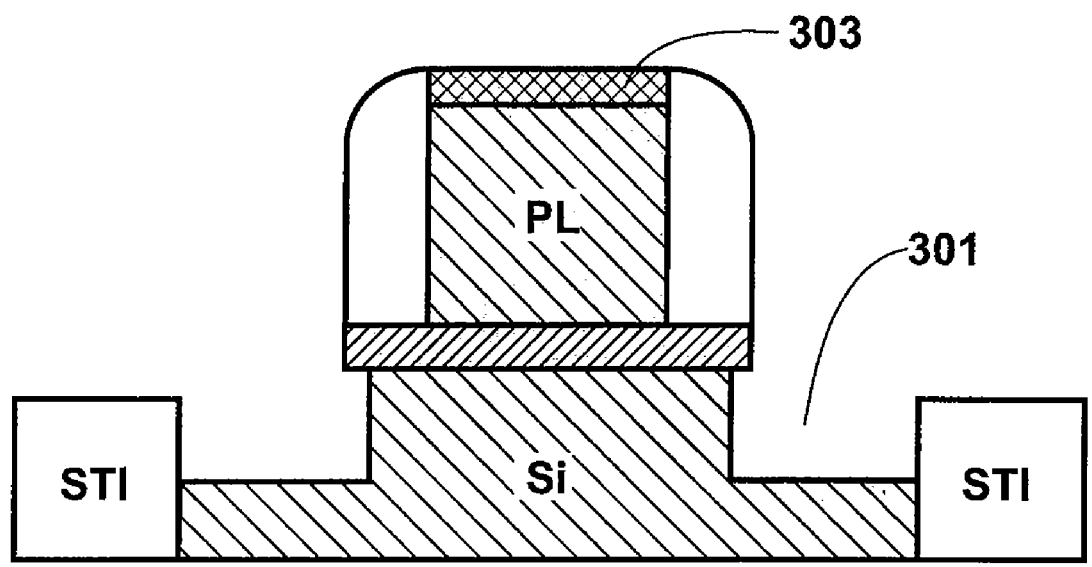
Figure 4:
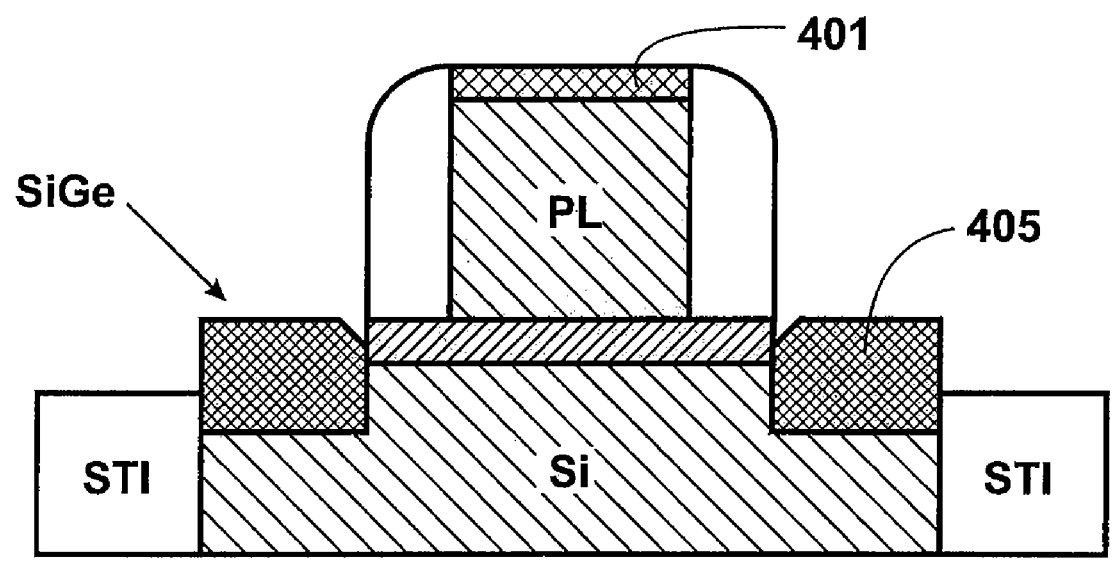

FIGS. 2 through 4 are simplified cross-sectional view diagrams of a method for fabricating a CMOS device according to an embodiment of the present invention. These diagrams are merely examples, which should not unduly limit the scope of the claims herein. One of ordinary skill in the art would recognize many variations, alternatives, and modifications. In a specific embodiment, the method forms a shallow trench isolation region or regions 205 within a portion of the semiconductor substrate 201. The shallow trench isolation regions are formed using patterning, etching, and deposition of a dielectric fill material within the trench region. The dielectric fill material is often oxide or a combination of oxide and nitride depending upon the specific embodiment. The isolation regions are used to isolate active regions within the semiconductor substrate.

The method forms a gate dielectric layer 207 overlying the surface of the substrate. Preferably, the gate dielectric layer is oxide or silicon oxynitride depending upon the embodiment. The gate dielectric layer is preferably 10-20 nanometers and less depending upon the specific embodiment. The method forms a gate layer overlying the semiconductor substrate. The gate layer is preferably polysilicon that has been doped using either in-situ doping or ex-situ implantation techniques. The impurity for doping is often boron, arsenic, or phosphorus having a concentration ranging from about 1E19 to about 1E20 atoms/cm3. Of course, one of ordinary skill in the art would recognize many variations, modifications, and alternatives.

Preferably, the method forms a hard mask layer overlying the gate structure. The hard mask layer can be made of any suitable material such as a dielectric material or a metal material, or any combination of these. The hard mask layer is deposited to a suitable thickness to protect the underlying gate structure during etching and deposition steps, which will be further described below. Referring to FIG. 2, the method patterns the gate layer to form an NMOS gate structure (not shown) including edges and patterns a PMOS gate structure 209 including edges. As shown, the hard mask 211 remains on the gate structure. The method forms lightly doped drain regions and sidewall spacers 213 on edges of patterned gate layer. The lightly doped drain regions are often formed using implantation techniques. For the PMOS device, the lightly doped drain region uses Boron or BF2 impurity having a concentration ranging from about 1E18 to about 1E19 atoms/cm3. For the NMOS device, the lightly doped drain region uses arsenic impurity having a concentration ranging from about 1E18 to about 1E19 atoms/cm3. Depending upon the embodiment, the method forms a dielectric layer overlying the NMOS gate structure to protect the NMOS gate structure including the edges. The method also forms a dielectric protective layer overlying the PMOS gate structure to protect the PMOS gate structure including the edges. Preferably, the dielectric protective layer is the same layer for PMOS and NMOS devices. Alternatively, another suitable material can be used to protect the NMOS and PMOS gate structures, including lightly doped drain regions.

Referring to FIG. 3, the method simultaneously etches a first source region and a first drain region adjacent to the NMOS gate structure and etches a second source region and a second drain region 301 adjacent to the PMOS gate structure using the dielectric layer as a protective layer. The method uses reactive ion etching techniques including a SF6 or CF4 bearing species and plasma environment. In a preferred embodiment, the method performs a pre-treatment process on etched source/drain regions, which preserves the etched interfaces to maintain substantially high quality silicon bearing material. According to a specific embodiment, the each of the etched regions has a depth of ranging from about 100 Angstroms (A) to about 1000 A and a length of about 0.1 um to about 10 um, and a width of about 0.1 um to about 10 um for a 90 nanometer channel length. Each of the etched regions has a depth of ranging from about 100 A to about 1,000 A and a length of about 0.1 um to about 10 um, and a width of about 0.1 um to about 10 um for a 65 nanometer channel length according to an alternative specific embodiment. Preferably, the hard mask remains on the gate structure and does not expose any of the gate structure during the etching process.

The method masks NMOS regions, while exposing the PMOS etched regions. The method deposits silicon germanium material 405 into the first source region and the first drain region to cause a channel region between the first source region and the first drain region of the PMOS gate structure to be strained in a compressive mode. The silicon germanium is epitaxially deposited using in-situ doping techniques. That is, impurities such as boron are introduced while the silicon germanium material grows. A concentration ranges from about 1E19 to about 1E20 of boron according to a specific embodiment. As shown, the hard mask 401 still remains in tact to selectively grow the silicon germanium material into the etched regions without depositing on the top of the gate structure. Of course, there can be other variations, modifications, and alternatives.

The method strips the mask from NMOS regions. The method masks PMOS regions, while exposing the NMOS etched regions. The method deposits silicon carbide material into the second source region and second drain region to cause the NMOS channel region between the second source region and the second drain region of the NMOS gate structure to be strained in a tensile mode. The silicon carbide is epitaxially deposited using in-situ doping techniques. That is, impurities such as phosphorous (P) or arsenic (As) are introduced while the silicon carbide material grows. A concentration ranges from about 1E19 to about 1E20 of the above impurities according to a specific embodiment. Of course, there can be other variations, modifications, and alternatives.

To finish the device according to an embodiment of the present invention, the method removes the hard mask to expose the top surface of the gate structures. Such gate structures are substantially free from any silicon germanium and/or silicon carbide bearing impurities. The gate structures are also substantially smooth and damage free. The method forms a silicide layer overlying gate layer and source/drain regions. Preferably, the silicide layer is a nickel bearing layer such as nickel silicide overlying the exposed source/drain regions and upper surface of the patterned gate layer. Other types of silicide layers can also be used. Such silicide layers include titanium silicide, tungsten silicide, nickel silicide, and the like. The method forms an interlayer dielectric layer overlying NMOS and PMOS transistor devices. The method then performs electrical contacts. Other steps include performing a back end processes and other steps, as desired.

The above sequence of steps provides a method according to an embodiment of the present invention. As shown, the method uses a combination of steps including a way of forming a CMOS integrated circuit device. In a preferred embodiment, the method provides a protective layer that is used for protecting a top portion of the gate structure during etching of recessed regions and selectively depositing silicon germanium material and/or silicon carbide material only on exposed surfaces of the recessed source/drain regions. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor integrated device comprising:
    providing a semiconductor substrate;
    forming a dielectric layer overlying the semiconductor substrate;
    forming a gate layer overlying the dielectric layer;
    forming a hard mask overlying the gate layer;
    patterning the gate layer to form a gate structure including edges using the hard mask as a protective layer;
    forming a dielectric layer overlying the gate structure to protect the gate structure including the edges;
    forming spacers from the dielectric layer, while maintaining the hard mask overlying the gate structure;
    etching a source region and a drain region adjacent to the gate structure using the dielectric layer and the hard mask as a protective layer, while the hard mask prevents any portion of the gate structure from being exposed;
    maintaining the hard mask overlying the gate structure;
    depositing silicon germanium material into the source region and the drain region to fill the etched source region and the etched drain region, while maintaining any portion of the gate layer from being exposed using the hard mask such that the gate structure is substantially free from any permanent deposition of silicon germanium material;
    causing a channel region between the source region and the drain region to be strained in compressive mode from at least the silicon germanium material formed in the source region and the drain region; and
    removing the hard mask from the gate structure to expose a top portion of the gate structure, the top portion of the gate structure being substantially free from any silicon germanium material.

2. The method of claim 1 wherein the dielectric layer is less than 300 Angstroms.

3. The method of claim 1 wherein the channel region has a length of a width of the gate structure.

4. The method of claim 1 wherein the semiconductor substrate is essential silicon material.

5. The method of claim 1 wherein the silicon germanium material is single crystalline.

6. The method of claim 1 wherein the silicon germanium has a ratio of silicon/germanium of 7:3 to 9:1.

7. The method of claim 1 further comprising forming a metal layer overlying the top portion of the gate structure.

8. The method of claim 7 further comprising thermally treating the metal layer to silicide the metal layer to the gate structure.

9. The method of claim 1 wherein the depositing of the silicon germanium material is provided using an epitaxial reactor.

10. The method of claim 1 wherein the compressive mode increases a mobility of holes in the channel region.

11. The method of claim 1 wherein the hard mask comprises a metal material or a dielectric material.

12. The method of claim 1 wherein the gate is polysilicon free from any germanium bearing species.

13. A method for forming a semiconductor integrated device comprising:
    providing a semiconductor substrate, the semiconductor substrate comprising a silicon bearing material of a first lattice constant;
    forming a dielectric layer overlying the semiconductor substrate;
    forming a gate layer comprising a polysilicon bearing material overlying the dielectric layer;
    forming a hard mask overlying the gate layer, the hard mask being of a predetermined thickness to be maintained throughout at least an etching and a deposition process;
    patterning the gate layer to form a gate structure including edges using the hard mask as a protective layer;
    forming a dielectric layer overlying the gate structure to protect the gate structure including the edges;
    forming spacers from the dielectric layer, while maintaining the hard mask overlying the gate structure;
    etching a source region and a drain region adjacent to the gate structure using the dielectric layer and the hard mask as a protective layer, while the hard mask prevents any portion of the gate structure from being exposed;
    maintaining the hard mask overlying the gate structure;
    depositing silicon germanium material into the source region and the drain region to fill the etched source region and the etched drain region, while maintaining any portion of the gate layer from being exposed using the hard mask such that the gate structure is substantially free from any permanent deposition of silicon germanium material;
    causing a channel region between the source region and the drain region to be strained in compressive mode from at least the silicon germanium material formed in the source region and the drain region; and
    removing the hard mask from the gate structure to expose a top portion of the gate structure, the top portion of the gate structure being substantially free from any silicon germanium material.

14. The method of claim 13 wherein the dielectric layer is less than 300 Angstroms.

15. The method of claim 13 wherein the channel region has a length of a width of the gate structure.

16. The method of claim 13 wherein the semiconductor substrate is essential silicon material.

17. The method of claim 13 wherein the silicon germanium material is single crystalline.

18. The method of claim 13 wherein the silicon germanium has a ratio of silicon/germanium of 7:3 to 9:1.

19. The method of claim 13 further comprising forming a metal layer overlying the top portion of the gate structure.

20. The method of claim 19 further comprising thermally treating the metal layer to silicide the metal layer to the gate structure.

* * * * *